US012621987B2

(12) United States Patent
Liu et al.

(10) Patent No.: US 12,621,987 B2
(45) Date of Patent: *May 5, 2026

(54) MEMORY DEVICES AND METHODS FOR FORMING THE SAME

(71) Applicant: YANGTZE MEMORY TECHNOLOGIES CO., LTD., Wuhan (CN)

(72) Inventors: Wei Liu, Wuhan (CN); Hongbin Zhu, Wuhan (CN); Wenyu Hua, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 375 days.

This patent is subject to a terminal disclaimer.

(21) Appl. No.: 18/205,282

(22) Filed: Jun. 2, 2023

(65) Prior Publication Data

US 2023/0397412 A1      Dec. 7, 2023

Related U.S. Application Data

(60) Provisional application No. 63/348,363, filed on Jun. 2, 2022.

(30) Foreign Application Priority Data

May 30, 2023    (CN) .......................... 202310646869.2

(51) Int. Cl.
*H10B 12/00* (2023.01)
*H10B 63/10* (2023.01)

(52) U.S. Cl.
CPC ............. *H10B 12/50* (2023.02); *H10B 12/05* (2023.02); *H10B 12/482* (2023.02); *H10B 12/485* (2023.02); *H10B 63/10* (2023.02)

(58) Field of Classification Search
CPC ...... H10B 12/00; H10B 12/05; H10B 12/315; H10B 12/482; H10B 12/485; H10B 12/50; H10B 61/00; H10B 61/22; H10B 63/00; H10B 63/10; H10B 63/34; H10B 63/80
See application file for complete search history.

(56) References Cited

U.S. PATENT DOCUMENTS

| 12,080,665 | B2 * | 9/2024 | Zhu | ......................... | H01L 25/50 |
| 12,349,341 | B2 * | 7/2025 | Liu | ...................... | H10B 63/10 |
| 2014/0021485 | A1 * | 1/2014 | Cho | ...................... | H10B 12/31 |
| | | | | | 257/77 |
| 2022/0189515 | A1 * | 6/2022 | Lee | ...................... | H10B 12/09 |
| 2023/0062083 | A1 * | 3/2023 | Zhu | ......................... | G11C 8/14 |
| 2023/0062141 | A1 * | 3/2023 | Zhu | ...................... | H10B 12/00 |
| 2023/0062524 | A1 * | 3/2023 | Liu | ...................... | H10B 63/10 |

* cited by examiner

*Primary Examiner* — Brook Kebede
(74) *Attorney, Agent, or Firm* — BAYES PLLC

(57) ABSTRACT

A memory device includes a memory cell and a peripheral circuit. The memory cell includes a vertical transistor having a first terminal and a second terminal, a storage unit having a first end coupled to the first terminal of the vertical transistor, and a bit line coupled to the second terminal of the vertical transistor. The peripheral circuit is coupled to the bit line. The vertical transistor includes a semiconductor body extending in a first direction, and a gate structure coupled to at least one side of the semiconductor body. The bit line is disposed between the vertical transistor and the peripheral circuit along the first direction.

20 Claims, 19 Drawing Sheets

100

101

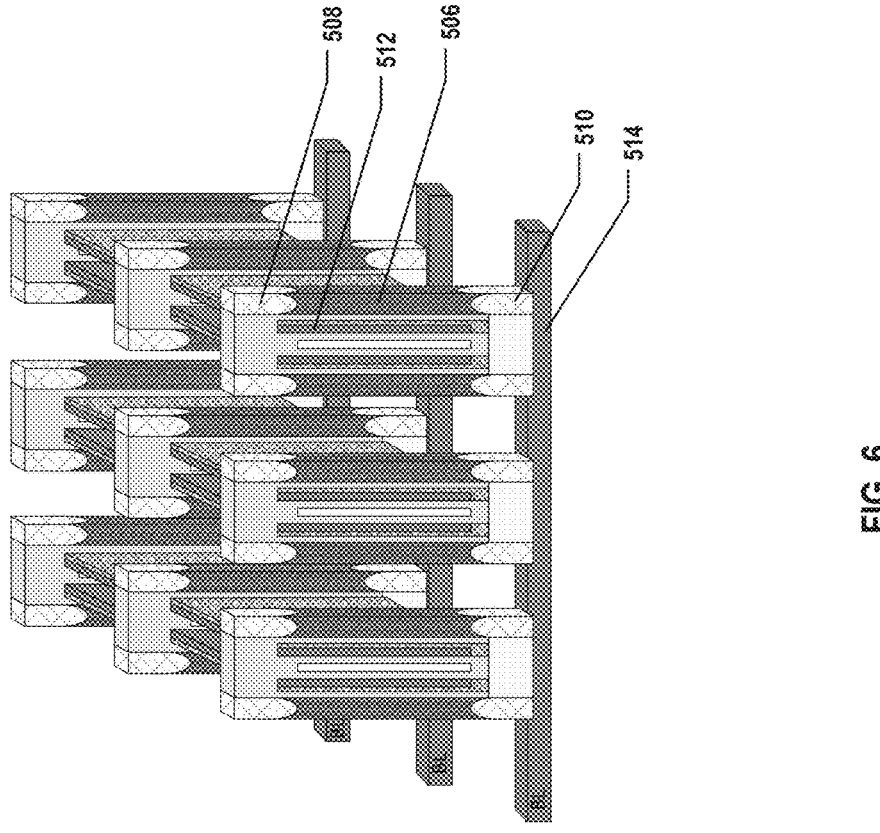
504
508
512
506
510
514
FIG. 6
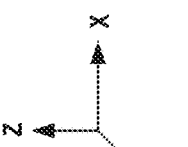

500

500

530

504

524

514

510

512

506

550

Z

X

500

536

534

538

532

X

Z

500

1700

1800

MEMORY DEVICES AND METHODS FOR FORMING THE SAME

CROSS-REFERENCE TO RELATED APPLICATIONS

This application claims the benefit of priorities to U.S. Provisional Application No. 63/348,363, filed on Jun. 2, 2022, and C.N. Application No. 202310646869.2, filed May 30, 2023, both of which are hereby incorporated by reference in their entireties.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a memory device is disclosed. The memory device includes a memory cell and a peripheral circuit. The memory cell includes a vertical transistor having a first terminal and a second terminal, a storage unit having a first end coupled to the first terminal of the vertical transistor, and a bit line coupled to the second terminal of the vertical transistor. The peripheral circuit is coupled to the bit line. The vertical transistor includes a semiconductor body extending in a first direction, and a gate structure coupled to at least one side of the semiconductor body. The bit line is disposed between the vertical transistor and the peripheral circuit along the first direction.

In some implementations, the bit line is coupled to the second terminal of the vertical transistor via a contact and extends in a second direction perpendicular to the first direction.

In some implementations, the gate structure is coupled to two sides of the semiconductor body along the second direction.

In some implementations, the gate structure is in contact with one or more sides of the semiconductor body.

In some implementations, the memory device further includes a bonding interface disposed between the memory cell and the peripheral circuit. The bit line is coupled to the peripheral circuit through a metallic bonding pad of the bonding interface.

In some implementations, the memory device further includes a redistribution layer disposed between the bit line and the bonding interface. A second end of the storage unit is coupled to the redistribution layer through a contact structure, the bit line is coupled to the redistribution layer, and the redistribution layer is coupled to the bonding interface.

In another aspect, a memory system is disclosed. The memory system includes a memory device configured to store data, and a memory controller coupled to the memory device. The memory device includes a memory cell and a peripheral circuit. The memory cell includes a vertical transistor having a first terminal and a second terminal, a storage unit having a first end coupled to the first terminal of the vertical transistor, and a bit line coupled to the second terminal of the vertical transistor. The peripheral circuit is coupled to the bit line. The vertical transistor includes a semiconductor body extending in a first direction, and a gate structure coupled to at least one side of the semiconductor body. The bit line is disposed between the vertical transistor and the peripheral circuit along the first direction. The memory controller is configured to control the memory cell through the peripheral circuit.

In still another aspect, a method for forming a memory device is disclosed. A vertical transistor having a first terminal and a second terminal is formed on a first substrate. A bit line is formed on the second terminal. A bonding interface is formed on the vertical transistor. A peripheral circuit is formed on a second substrate. The peripheral circuit is bonded with the bonding interface in a face-to-face manner. The first substrate is removed to expose the vertical transistor. A storage unit is formed on the first terminal.

In some implementations, a first trench is formed in the first substrate along a first direction and extending along a second direction perpendicular to the first direction. A first trench isolation is formed in the first trench. A second trench is formed in the first substrate along the first direction and extends along a third direction perpendicular to the first direction and the second direction. A gate structure is formed in the second trench.

In some implementations, after forming the second trench, a semiconductor body is formed extending along the first direction between the second trench and the first trench isolation.

In some implementations, a third trench is formed along the first direction and extends along the third direction to divide the semiconductor body, and a second trench isolation is formed in the third trench.

In some implementations, a doping operation is performed on a first end of the semiconductor body to form the second terminal.

In some implementations, a planarization operation is performed having the second substrate as a support substrate.

In some implementations, an implantation operation and a thermal diffusion operation are performed on an exposed semiconductor body to form the first terminal at a second end of the semiconductor body.

In some implementations, the storage unit is formed after bonding the peripheral circuit with the bonding interface.

In yet another aspect, a method for forming a memory device is disclosed. A vertical transistor is formed on a first substrate. A peripheral circuit is formed on a second substrate. The peripheral circuit is bonded with the vertical transistor in a face-to-face manner. The first substrate is removed to expose the vertical transistor, and a storage unit is formed on the vertical transistor.

In some implementations, a semiconductor body is formed on the first substrate extending along a first direction. A gate structure is formed at a side of the semiconductor body. A second terminal is formed at a first end of the semiconductor body. After removing the first substrate to expose the vertical transistor, a first terminal is formed at a second end of the semiconductor body.

In some implementations, a bonding interface is formed on the vertical transistor, and the peripheral circuit is bonded to the bonding interface.

In some implementations, a bit line is formed on the second terminal, a redistribution layer is formed on the bit line, a bonding interface is formed on the redistribution layer, and the peripheral circuit is bonded to the bonding interface.

In some implementations, the first substrate is removed using the second substrate as a support substrate to expose the vertical transistor.

In some implementations, the storage unit is formed after bonding the peripheral circuit with the vertical transistor.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 6 illustrates a schematic diagram of a perspective view of a vertical transistor, according to some aspects of the present disclosure.

Figure 1A:
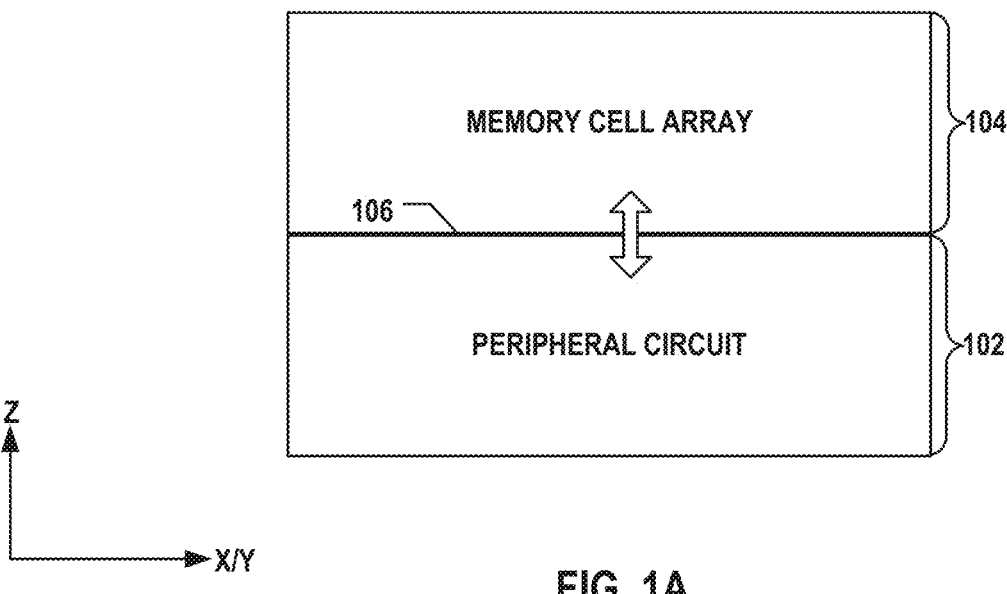
FIG. 1A illustrates a schematic view of a cross-section of a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

On the other hand, the memory cell array and the peripheral circuits for controlling the memory cell array are usually arranged side-by-side in the same plane. As the number of memory cells keeps increasing, to maintain the same chip size, the dimensions of the components in the memory cell array, such as transistors, word lines, and/or bit lines, need to keep decreasing in order not to significantly reduce the memory cell array efficiency.

To address one or more of the aforementioned issues, the present disclosure introduces a solution in which vertical transistors replace the planar transistors as the switch and selecting devices in a memory cell array of memory devices (e.g., DRAM, PCM, and FRAM). Compared with planar transistors, the vertically arranged transistors (e.g., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and on below the transistors), such that the process margin of the bit lines can be increased and the coupling capacitance between the bit lines and the storage units can be decreased.

Consistent with the scope of the present disclosure, according to some aspects of the present disclosure, the memory cell array having vertical transistors and the peripheral circuits of the memory cell array can be formed on different wafers and bonded together in a face-to-face manner. Thus, the thermal budget for fabricating the memory cell array does not affect the fabrication of the peripheral circuits. The stacked memory cell array and peripheral circuits can also reduce the chip size compared with the side-by-side arrangement, thereby improving the array efficiency. In some implementations, more than one memory cell array is stacked over one another using bonding techniques to further increase the array efficiency. In some implementations, the word lines and bit lines are disposed close to the bonding interface due to the vertically arranged transistors, which can be coupled to the peripheral circuits through a large number (e.g., millions) of parallel bonding contacts across the bonding interface can make direct, short-distance (e.g., micron-level) electrical connections between the memory cell array and peripheral circuits to increase the throughput and input/output (I/O) speed of the memory devices.

In some implementations, the vertical transistors disclosed herein include multi-gate transistors (e.g., gate-all-around (GAA) transistors, tri-gate transistors, or double-gate transistors), which can have a larger gate control area to achieve better channel control with a smaller subthreshold swing. Since the channel is fully depleted, the leakage current of multi-gate transistors can be significantly reduced as well. Thus, using multi-gate transistors instead of planar transistors can achieve a much better speed (saturated drain current)/leakage current performance.

In some implementations, the vertical transistors disclosed herein include single-gate transistors (a.k.a. single-side gate transistors) in a mirror-symmetric arrangement with respect to adjacent transistors in the bit line direction as a result of splitting multi-gate transistors (e.g., double-gate transistors) using trench isolations extending along the word line direction. Thus, the memory cell density in the bit line direction can be significantly increased (e.g., doubled) without unduly complicating the fabrication process compared with using processes, such as self-aligned double patterning (SADP). Also, the mirror-symmetric single-gate transistors have a larger process window for word line, bit line, and transistor pitch reduction, compared to either planar transistors or multi-gate vertical transistors, for example, with dual-side or all-around gates.

FIG. 1A illustrates a schematic view of a cross-section of a memory device 100, according to some aspects of the present disclosure. Memory device 100 represents an example of a bonded chip. The components of memory device 100 (e.g., memory cell array and peripheral circuits) can be formed separately on different substrates and then jointed to form a bonded chip. Memory device 100 can include a first semiconductor structure 102 including the peripheral circuits of a memory cell array. Memory device 100 can also include a second semiconductor structure 104 including the memory cell array. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first semiconductor structure 102 use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 1A, memory device 100 can also include second semiconductor structure 104 including an array of memory cells (memory cell array) that can use transistors as the switch and selecting devices. In some implementations, the memory cell array includes an array of DRAM cells. For ease of description, a DRAM cell array may be used as an example for describing the memory cell array in the present disclosure. But it is understood that the memory cell array is not limited to DRAM cell array and may include any other suitable types of memory cell arrays that can use transistors as the switch and selecting devices, such as PCM cell array, static random-access memory (SRAM) cell array, FRAM cell array, resistive memory cell array, magnetic memory cell array, spin transfer torque (STT) memory cell array, to name a few, or any combination thereof.

Second semiconductor structure 104 can be a DRAM device in which memory cells are provided in the form of an array of DRAM cells. In some implementations, each DRAM cell includes a capacitor for storing a bit of data as a positive or negative electrical charge as well as one or more transistors (a.k.a. pass transistors) that control (e.g., switch and selecting) access to it. In some implementations, each DRAM cell is a one-transistor, one-capacitor (1T1C) cell. Since transistors always leak a small amount of charge, the capacitors will slowly discharge, causing information stored in them to drain. As such, a DRAM cell has to be refreshed to retain data, for example, by the peripheral circuit in first semiconductor structure 102, according to some implementations.

As shown in FIG. 1A, memory device 100 further includes a bonding interface 106 vertically between (in the vertical direction, e.g., the Z-direction in FIG. 1A) first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., milli-meter or centimeter-level) chip-to-chip data bus on the circuit board, such as printed circuit board (PCB), thereby eliminating chip interface delay and achieving high-speed I/O throughput with reduced power consumption. Data transfer between the memory cell array in second semicon-ductor structure 104 and the peripheral circuits in first semiconductor structure 102 can be performed through the interconnects (e.g., bonding contacts) across bonding inter-face 106. By vertically integrating first and second semi-conductor structures 102 and 104, the chip size can be reduced, and the memory cell density can be increased.

Figure 1B:
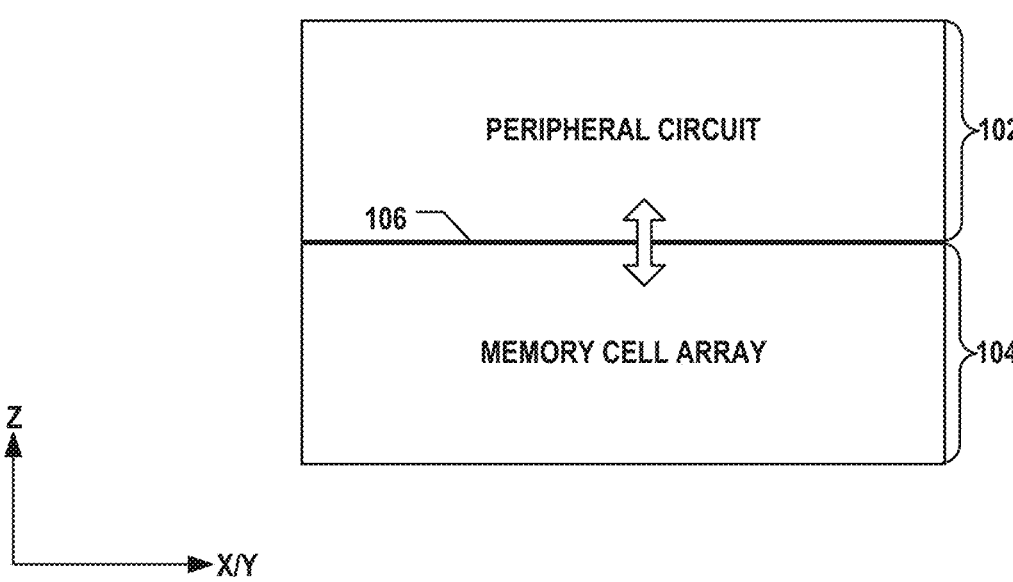
FIG. 1B illustrates a schematic view of a cross-section of another memory device, according to some aspects of the present disclosure.

It is understood that the relative positions of stacked first and second semiconductor structures 102 and 104 are not limited. FIG. 1B illustrates a schematic view of a cross-section of another exemplary memory device 101, according to some implementations. Different from memory device 100 in FIG. 1A, in which second semiconductor structure 104 including the memory cell array is above first semicon-ductor structure 102 including the peripheral circuits, in memory device 101 in FIG. 1B, first semiconductor struc-ture 102 including the peripheral circuit is above second semiconductor structure 104 including the memory cell array. Nevertheless, bonding interface 106 is formed verti-cally between first and second semiconductor structures 102 and 104 in memory device 101, and first and second semiconductor structures 102 and 104 are jointed vertically through bonding (e.g., hybrid bonding) according to some implementations. Hybrid bonding, also known as "metal/dielectric hybrid bonding," is a direct bonding technology (e.g., forming bonding between surfaces without using inter-mediate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array in second semiconductor structure 104 and the peripheral circuits in first semiconductor structure 102 can be per-formed through the interconnects (e.g., bonding contacts) across bonding interface 106.

It is noted that X, Y, and Z axes are included in FIGS. 1A and 1B to further illustrate the spatial relationship of the components in memory devices 100 and 101. The substrate of the memory device includes two lateral surfaces extend-ing laterally in the X-Y plane: a top surface on the front side of the wafer on which the semiconductor devices can be formed, and a bottom surface on the backside opposite to the front side of the wafer. The Z-axis is perpendicular to both the X and Y axes. As used herein, whether one component (e.g., a layer or a device) is "on," "above," or "below" another component (e.g., a layer or a device) of the memory device is determined relative to the substrate of the memory device in the Z-direction (the vertical direction perpendicu-lar to the X-Y plane, e.g., the thickness direction of the substrate) when the substrate is positioned in the lowest plane of the memory device in the Z-direction. The same notion for describing the spatial relationships is applied throughout the present disclosure.

Figure 2:
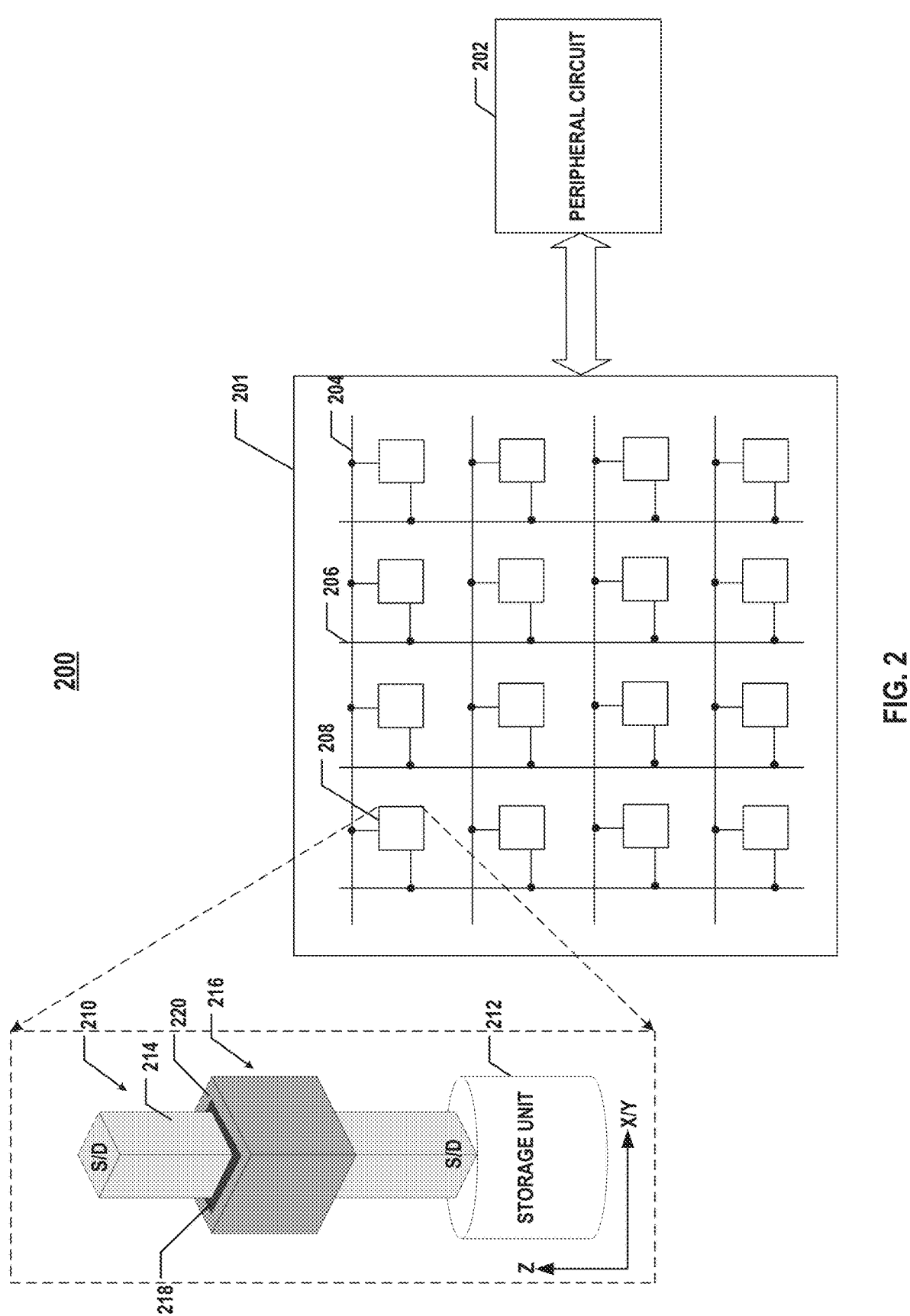
FIG. 2 illustrates a schematic diagram of a memory device including peripheral circuits and an array of memory cells each having a vertical transistor, according to some aspects of the present disclosure.

FIG. 2 illustrates a schematic diagram of a memory device 200 including peripheral circuits and an array of memory cells each having a vertical transistor, according to some aspects of the present disclosure. Memory device 200 can include a memory cell array 201 and peripheral circuits 202 coupled to memory cell array 201. Memory devices 100 and 101 may be examples of memory device 200 in which memory cell array 201 and peripheral circuits 202 may be included in second and first semiconductor structures 104 and 102, respectively. Memory cell array 201 can be any suitable memory cell array in which each memory cell 208 includes a vertical transistor 210 and a storage unit 212 coupled to vertical transistor 210. In some implementations, memory cell array 201 is a DRAM cell array, and storage unit 212 is a capacitor for storing charge as the binary information stored by the respective DRAM cell. In some implementations, memory cell array 201 is a PCM cell array, and storage unit 212 is a PCM element (e.g., including chalcogenide alloys) for storing binary information of the respective PCM cell based on the different resistivities of the PCM element in the amorphous phase and the crystalline phase. In some implementations, memory cell array 201 is a FRAM cell array, and storage unit 212 is a ferroelectric capacitor for storing binary information of the respective FRAM cell based on the switch between two polarization states of ferroelectric materials under an external electric field.

As shown in FIG. 2, memory cells 208 can be arranged in a two-dimensional (2D) array having rows and columns. Memory device 200 can include word lines 204 coupling peripheral circuits 202 and memory cell array 201 for controlling the switch of vertical transistors 210 in memory cells 208 located in a row, as well as bit lines 206 coupling peripheral circuits 202 and memory cell array 201 for sending data to and/or receiving data from memory cells 208 located in a column. That is, each word line 204 is coupled to a respective row of memory cells 208, and each bit line is coupled to a respective column of memory cells 208.

Consistent with the scope of the present disclosure, vertical transistors 210, such as vertical metal-oxide-semiconductor field-effect transistors (MOSFETs), can replace the planar transistors as the pass transistors of memory cells 208 to reduce the area occupied by the pass transistors, the coupling capacitance, as well as the interconnect routing complexity, as described below in detail. As shown in FIG. 2, in some implementations, different from planar transistors in which the active regions are formed in the substrates, vertical transistor 210 includes a semiconductor body 214 extending vertically (in the Z-direction) above the substrate (not shown). That is, semiconductor body 214 can extend above the top surface of the substrate to allow channels to be formed not only at the top surface of semiconductor body 214, but also at one or more side surfaces thereof. As shown in FIG. 2, for example, semiconductor body 214 can have a cuboid shape to expose four sides thereof. It is understood that semiconductor body 214 may have any suitable 3D shape, such as polyhedron shapes or a cylinder shape. That is, the cross-section of semiconductor body 214 in the plan view (e.g., in the X-Y plane) can have a square shape, a rectangular shape (or a trapezoidal shape), a circular (or an oval shape), or any other suitable shapes. It is understood that consistent with the scope of the present disclosure, for semiconductor bodies that have a circular or oval shape of their cross-sections in the plan view, the semiconductor bodies may still be considered as having multiple sides, such that the gate structures are in contact with more than one side of the semiconductor bodies. As described below with respect to the fabrication process, semiconductor body 214 can be formed from the substrate (e.g., by etching or epitaxy) and thus, has the same semiconductor material (e.g., silicon crystalline silicon) as the substrate (e.g., a silicon substrate).

As shown in FIG. 2, vertical transistor 210 can also include a gate structure 216 in contact with one or more sides of semiconductor body 214, e.g., in one or more planes of the side surface(s) of the active region. In other words, the active region of vertical transistor 210, e.g., semiconductor body 214, can be at least partially surrounded by gate structure 216. Gate structure 216 can include a gate dielectric 218 over one or more sides of semiconductor body 214, e.g., in contact with four side surfaces of semiconductor body 214, as shown in FIG. 2. Gate structure 216 can also include a gate electrode 220 over and in contact with gate dielectric 218. Gate dielectric 218 can include any suitable dielectric materials, such as silicon oxide, silicon nitride, silicon oxynitride, or high-k dielectrics. For example, gate dielectric 218 may include silicon oxide, which is a form of gate oxide. Gate electrode 220 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 220 may include doped polysilicon, which is a form of a gate poly. In some implementations, gate electrode 220 includes multiple conductive layers, such as a W layer over a TiN layer. It is understood that gate electrode 220 and word line 204 may be a continuous conductive structure in some examples. In other words, gate electrode 220 may be viewed as part of word line 204 that forms gate structure 216, or word line 204 may be viewed as the extension of gate electrode 220 to be coupled to peripheral circuits 202.

As shown in FIG. 2, vertical transistor 210 can further include a pair of a source and a drain (S/D, dope regions, a.k.a., source electrode and drain electrode) formed at the two ends of semiconductor body 214 in the vertical direction (the z-direction), respectively. The source and drain can be doped with any suitable P-type dopants, such as boron (B) or Gallium (Ga), or any suitable N-type dopants, such as phosphorus (P) or arsenic (As). The source and drain can be separated by gate structure 216 in the vertical direction (the z-direction). In other words, gate structure 216 is formed vertically between the source and drain. As a result, one or more channels (not shown) of vertical transistor 210 can be formed in semiconductor body 214 vertically between the source and drain when a gate voltage applied to gate electrode 220 of gate structure 216 is above the threshold voltage of vertical transistor 210. That is, each channel of vertical transistor 210 is also formed in the vertical direction along which semiconductor body 214 extends, according to some implementations.

In some implementations, as shown in FIG. 2, vertical transistor 210 is a multi-gate transistor. That is, gate structure 216 can be in contact with more than one side of semiconductor body 214 (e.g., four sides in FIG. 2) to form more than one gate, such that more than one channel can be formed between the source and drain in operation. That is, different from the planar transistor that includes only a single planar gate (and resulting in a single planar channel), vertical transistor 210 shown in FIG. 2 can include multiple vertical gates on multiple sides of semiconductor body 214 due to the 3D structure of semiconductor body 214 and gate structure 216 that surrounds the multiple sides of semiconductor body 214. As a result, compared with planar transistors, vertical transistor 210 shown in FIG. 2 can have a larger gate control area to achieve better channel control with a smaller subthreshold swing. Since the channel is fully depleted, the leakage current ($I_{off}$) of vertical transistor 210 can be significantly reduced as well. As described below in detail, the multi-gate vertical transistors can include double-gate vertical transistors (e.g., dual-side gate vertical transistors), tri-gate vertical transistors (e.g., tri-side gate vertical transistors), and GAA vertical transistors.

It is understood that although vertical transistor 210 is shown as a multi-gate transistor in FIG. 2, the vertical transistors disclosed herein may also include single-gate transistors as described below in detail. That is, gate structure 216 may be in contact with a single side of semiconductor body 214, for example, for the purpose of increasing the transistor and memory cell density. It is also understood that although gate dielectric 218 is shown as being separate (a separate structure) from other gate dielectrics of adjacent vertical transistors (not shown), gate dielectric 218 may be part of a continuous dielectric layer having multiple gate dielectrics of vertical transistors.

In planar transistors and some lateral multiple-gate transistors (e.g., FinFET), the active regions, such as semiconductor bodies (e.g., Fins), extend laterally (in the X-Y plane), and the source and the drain are disposed at different locations in the same lateral plane (the X-Y plane). In contrast, in vertical transistor 210, semiconductor body 214 extends vertically (in the Z-direction), and the source and the drain are disposed in the different lateral planes, according to some implementations. In some implementations, the source and the drain are formed at two ends of semiconductor body 214 in the vertical direction (the Z-direction), respectively, thereby overlapping in the plan view. As a result, the area (in the X-Y plane) occupied by vertical transistor 210 can be reduced compared with planar transistors and lateral multiple-gate transistors. Also, the metal wiring coupled to vertical transistors 210 can be simplified as well since the interconnects can be routed in different planes. For example, bit lines 206 and storage units 212 may be formed on opposite sides of vertical transistor 210. In one example, bit line 206 may be coupled to the source or the drain at the upper end of semiconductor body 214, while storage unit 212 may be coupled to the other source or the drain at the lower end of semiconductor body 214.

As shown in FIG. 2, storage unit 212 can be coupled to the source or the drain of vertical transistor 210. Storage unit 212 can include any devices that are capable of storing binary data (e.g., 0 and 1), including but not limited to, capacitors for DRAM cells and FRAM cells, and PCM elements for PCM cells. In some implementations, vertical transistor 210 controls the selection and/or the state switch of the respective storage unit 212 coupled to vertical transistor 210.

Figure 3:
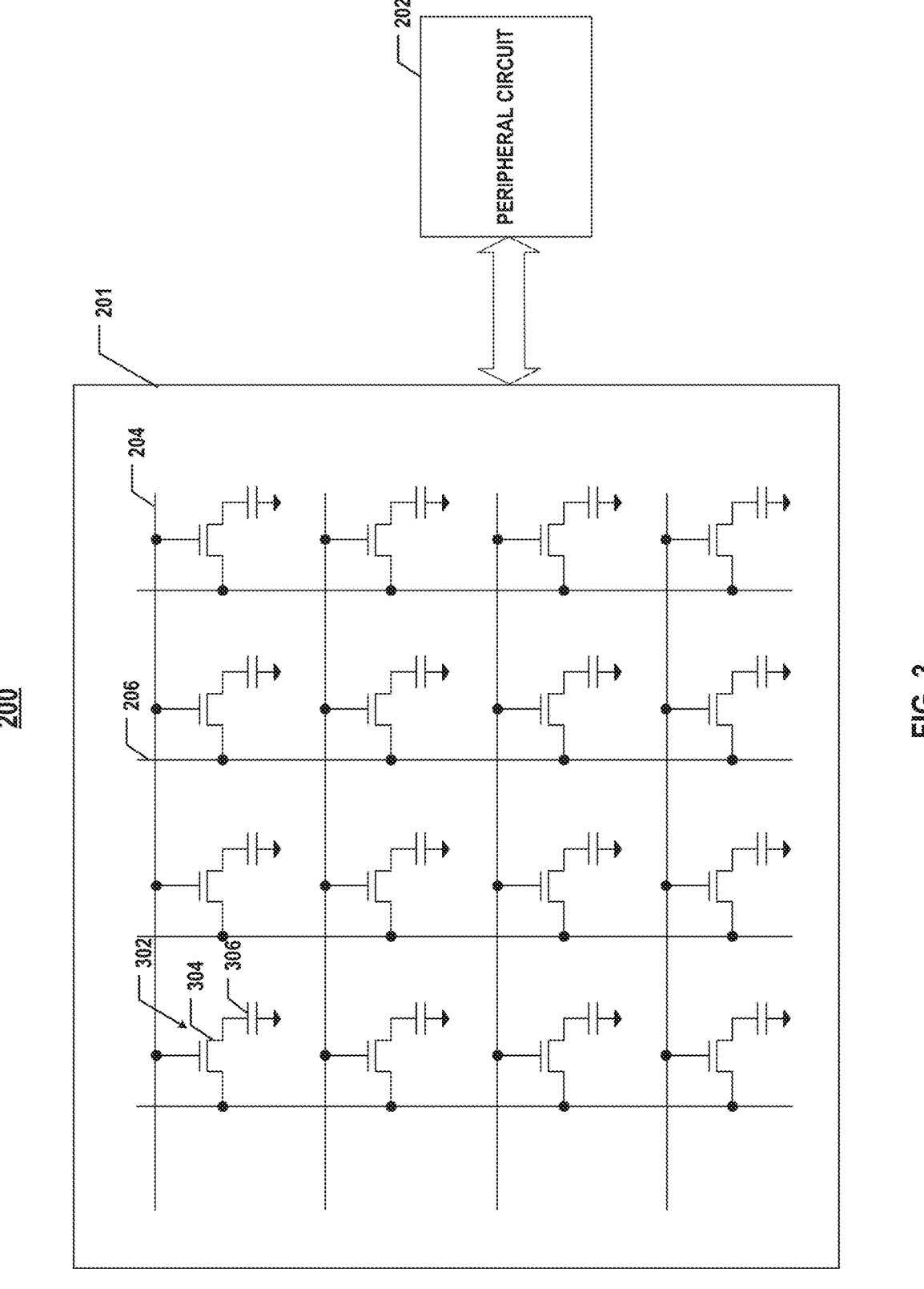
FIG. 3 illustrates a schematic circuit diagram of a memory device including peripheral circuits and an array of dynamic random-access memory (DRAM) cells, according to some aspects of the present disclosure.

FIG. 3 illustrates a schematic diagram of memory device 200 including peripheral circuits and an array of memory cells each having a vertical transistor, according to some aspects of the present disclosure. In some implementations as shown in FIG. 3, each memory cell 208 is a DRAM cell 302 including a transistor 304 (e.g., implementing using vertical transistors 210 in FIG. 2) and a capacitor 306 (e.g., an example of storage unit 212 in FIG. 2). The gate of transistor 304 (e.g., corresponding to gate electrode 220) may be coupled to word line 204, one of the source and the drain of transistor 304 may be coupled to bit line 206, the other one of the source and the drain of transistor 304 may be coupled to one electrode of capacitor 306, and the other electrode of capacitor 306 may be coupled to the ground.

Figure 4:
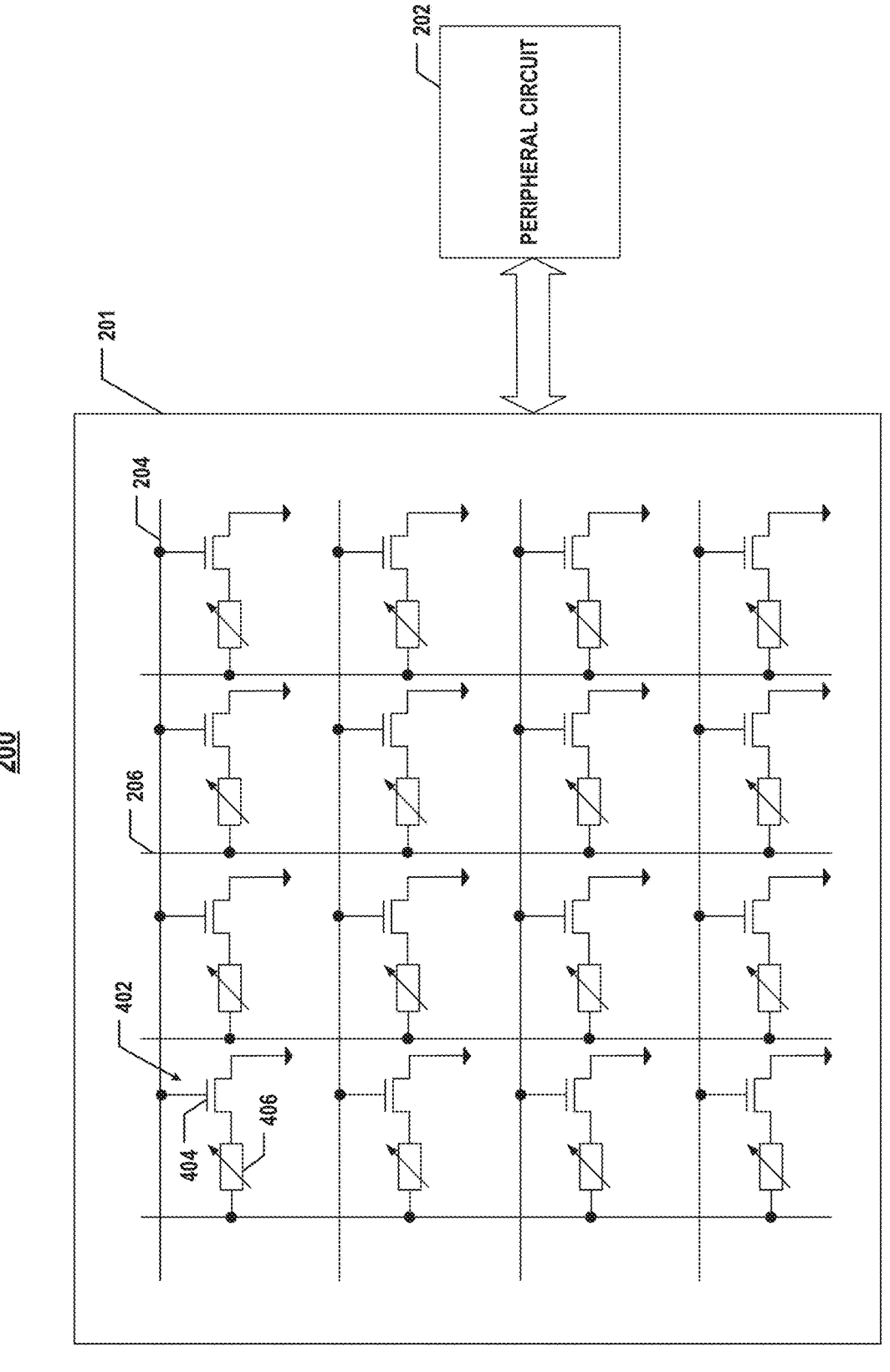
FIG. 4 illustrates a schematic circuit diagram of a memory device including peripheral circuits and an array of phase-change memory (PCM) cells, according to some aspects of the present disclosure.

FIG. 4 illustrates a schematic diagram of memory device 200 including peripheral circuits and an array of memory cells each having a vertical transistor, according to some aspects of the present disclosure. In some implementations as shown in FIG. 4, each memory cell 208 is a PCM cell 402 including a transistor 404 (e.g., implementing using vertical transistors 210 in FIG. 2) and a PCM element 406 (e.g., an example of storage unit 212 in FIG. 2). The gate of transistor 404 (e.g., corresponding to gate electrode 220) may be coupled to word line 204, one of the source and the drain of transistor 404 may be coupled to the ground, the other one of the source and the drain of transistor 404 may be coupled to one electrode of PCM element 406, and the other electrode of PCM element 406 may be coupled to bit line 206.

Figure 5:
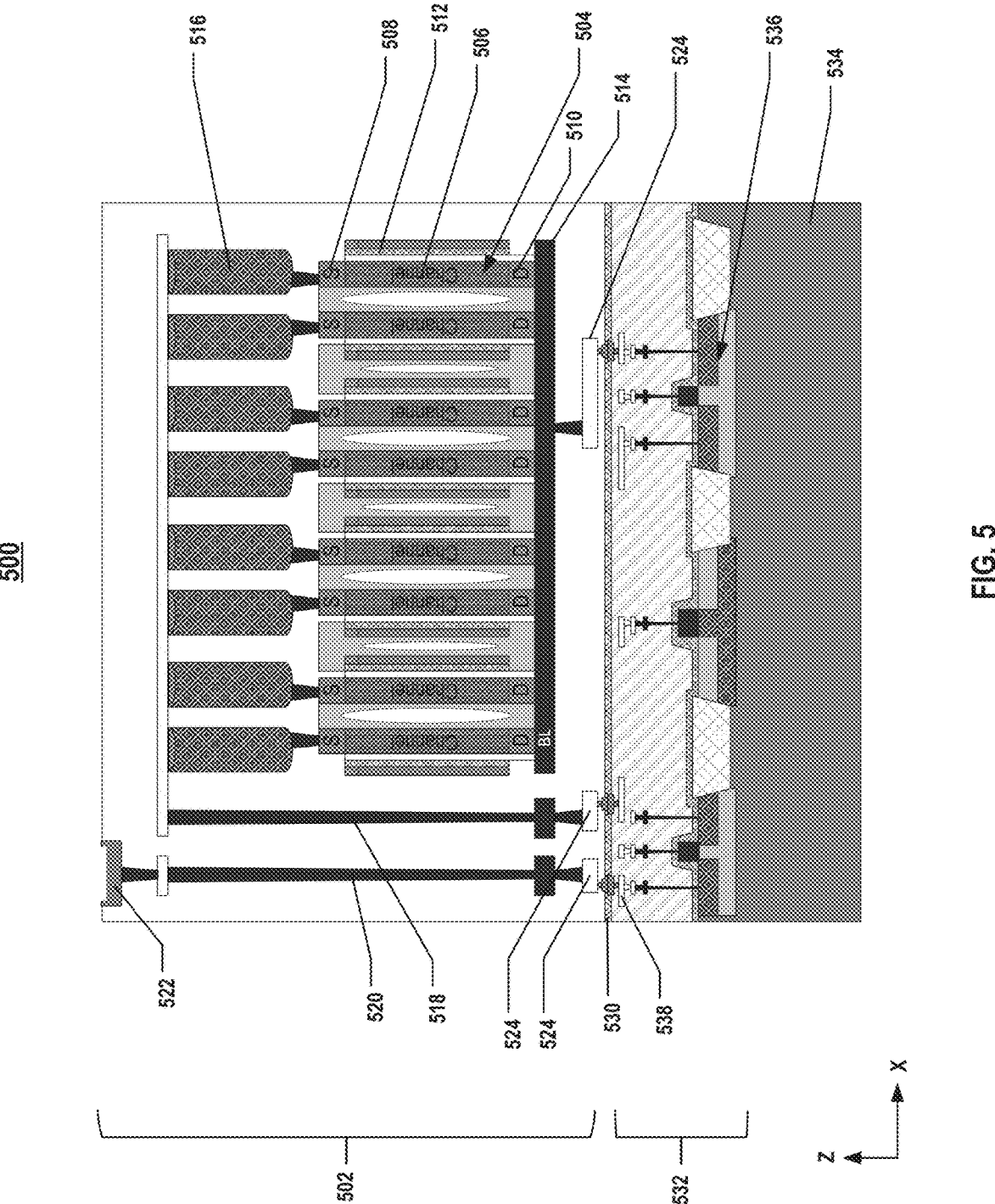
FIG. 5 illustrates a schematic view of a cross-section of a memory device, according to some aspects of the present disclosure.

FIG. 5 illustrates a schematic view of a cross-section of a memory device 500, according to some aspects of the present disclosure. As shown in FIG. 5, memory device 500 includes a memory cell 502 and a peripheral circuit 532. Memory cell 502 includes a vertical transistor 504 extending along the Z-direction. In some implementations, vertical transistor 504 includes a semiconductor body 506 extending in the Z-direction, a first terminal 508, e.g., the source terminal, and a second terminal 510, e.g., the drain terminal. As shown in FIG. 5, first terminal 508 and second terminal 510 are formed at two ends of semiconductor body 506 along the Z-direction, which is the stacking direction of memory cell 502 and peripheral circuit 532. Vertical transistor 504 also includes a gate structure 512 coupled to at least one side of semiconductor body 506. In some implementations, gate structure 512 may be formed on one side of semiconductor body 506, e.g., the single-side gate structure.

In some implementations, gate structure 512 may be formed on two sides of semiconductor body 506, e.g., the dual gate structure. In some implementations, gate structure 512 may be formed around semiconductor body 506, e.g., the gate all around (GAA) structure. In some implementations, gate structure 512 may be a multiple-layer structure, including the gate dielectric layer, the barrier layer, and the metal gate layer.

In some implementations, memory cell 502 also includes a storage unit 516 having a first end coupled to first terminal 508 of vertical transistor 504. A bit line 514 is coupled to second terminal 510 of vertical transistor 504. As shown in FIG. 5, a bonding interface 530 is formed between memory cell 502 and peripheral circuit 532. In some implementations, bonding interface 530 may be a boundary between memory cell 502 and peripheral circuit 532. In some implementations, bonding interface 530 may be an interface during the bonding operations of memory cell 502 and peripheral circuit 532.

Peripheral circuit 532 (a.k.a. control and sensing circuits 536) can include any suitable digital, analog, and/or mixed-signal circuits used for facilitating the operations of the memory cell 502. For example, peripheral circuit 532 can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). Peripheral circuit 532 is formed on a substrate 534 using complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, nm, 7 nm, 5 nm, 3 nm, 2 nm, etc.), according to some implementations.

As shown in FIG. 5, bit line 514 is disposed between vertical transistor 504 and peripheral circuit 532 along the Z-direction, and peripheral circuit 532 is coupled to bit line 514 through bonding interface 530. In some implementations, bit line 514 is coupled to second terminal 510 of vertical transistor 504 via a contact and extends in the X-direction perpendicular to the Z-direction. In some implementations, bonding interface 530 is arranged between memory cell 502 and peripheral circuit 532. Bit line 514 is coupled to peripheral circuit 532 through a metallic bonding pad of bonding interface 530. In some implementations, memory device 500 further includes a redistribution layer 524 disposed between bit line 514 and bonding interface 530. A second end of storage unit 516 is coupled to redistribution layer 524 through a contact structure 518, bit line 514 is coupled to redistribution layer 524, and redistribution layer 524 is coupled to bonding interface 530. In some implementations, memory device 500 further includes a redistribution layer 538 formed in peripheral circuit 532, and the devices in peripheral circuit 532 may be coupled to bonding interface 530 through redistribution layer 538. In some implementations, memory device 500 further includes a contact structure 520 penetrating the structure of memory device 500 to couple a pad 522 to redistribution layer 524.

FIG. 6 illustrates a schematic diagram of a perspective view of vertical transistor 504, according to some aspects of the present disclosure. In some implementations, vertical transistor 504 includes semiconductor body 506 extending in the Z-direction. First terminal 508, e.g., the source terminal, and second terminal 510, e.g., the drain terminal, are formed at two ends of semiconductor body 506 along the Z-direction, which is the stacking direction of memory cell 502 and peripheral circuit 532. In some implementations, the location of the source terminal and the drain terminal may be exchanged in different applications. For example, first terminal 508 may be the drain terminal, and second terminal 510 may be the source terminal. Vertical transistor 504 also includes gate structure 512 coupled to at least one side of semiconductor body 506. In some implementations, gate structure 512 may be formed on one side of semiconductor body 506, e.g., the single-side gate structure. In some implementations, gate structure 512 may be formed on two sides of semiconductor body 506, e.g., the dual gate structure. In some implementations, gate structure 512 may be formed around semiconductor body 506, e.g., the GAA structure. In some implementations, gate structure 512 may be a multiple-layer structure, including the gate dielectric layer, the barrier layer, and the metal gate layer.

Figure 7:
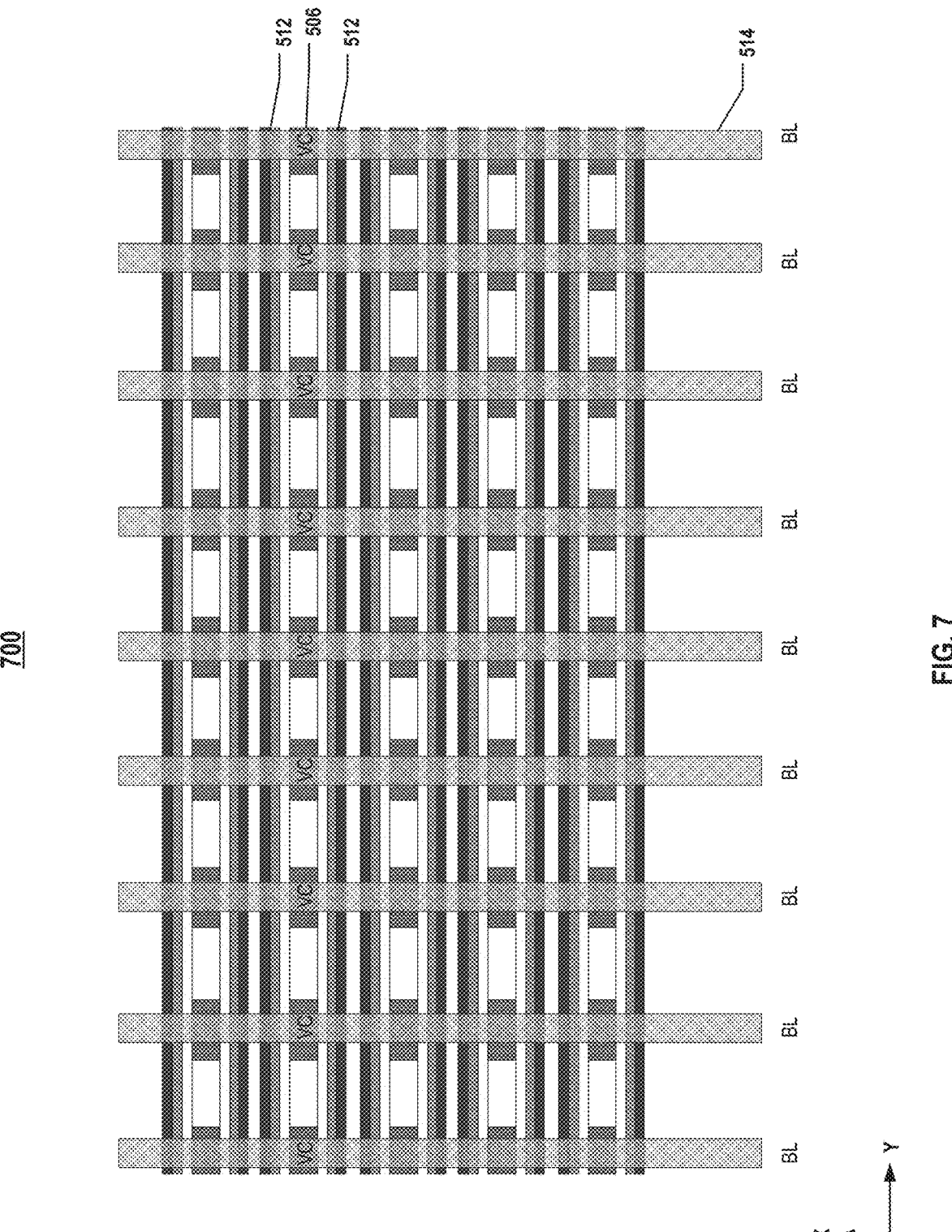
FIG. 7 illustrates a schematic view of a plan view of a memory device, according to some aspects of the present disclosure.

FIG. 7 illustrates a schematic view of a plan view of a memory device 700, according to some aspects of the present disclosure. As shown in FIG. 7, gate structure 512 may be formed on two sides of semiconductor body 506, and vertical transistor 504 is a dual gate transistor. In other words, gate structure 512 may control the vertical transistor 504 from both sides of semiconductor body 506. In some implementations, gate structure 512 may be a multiple-layer structure, including the gate dielectric layer, the barrier layer, and the metal gate layer.

Figure 8:
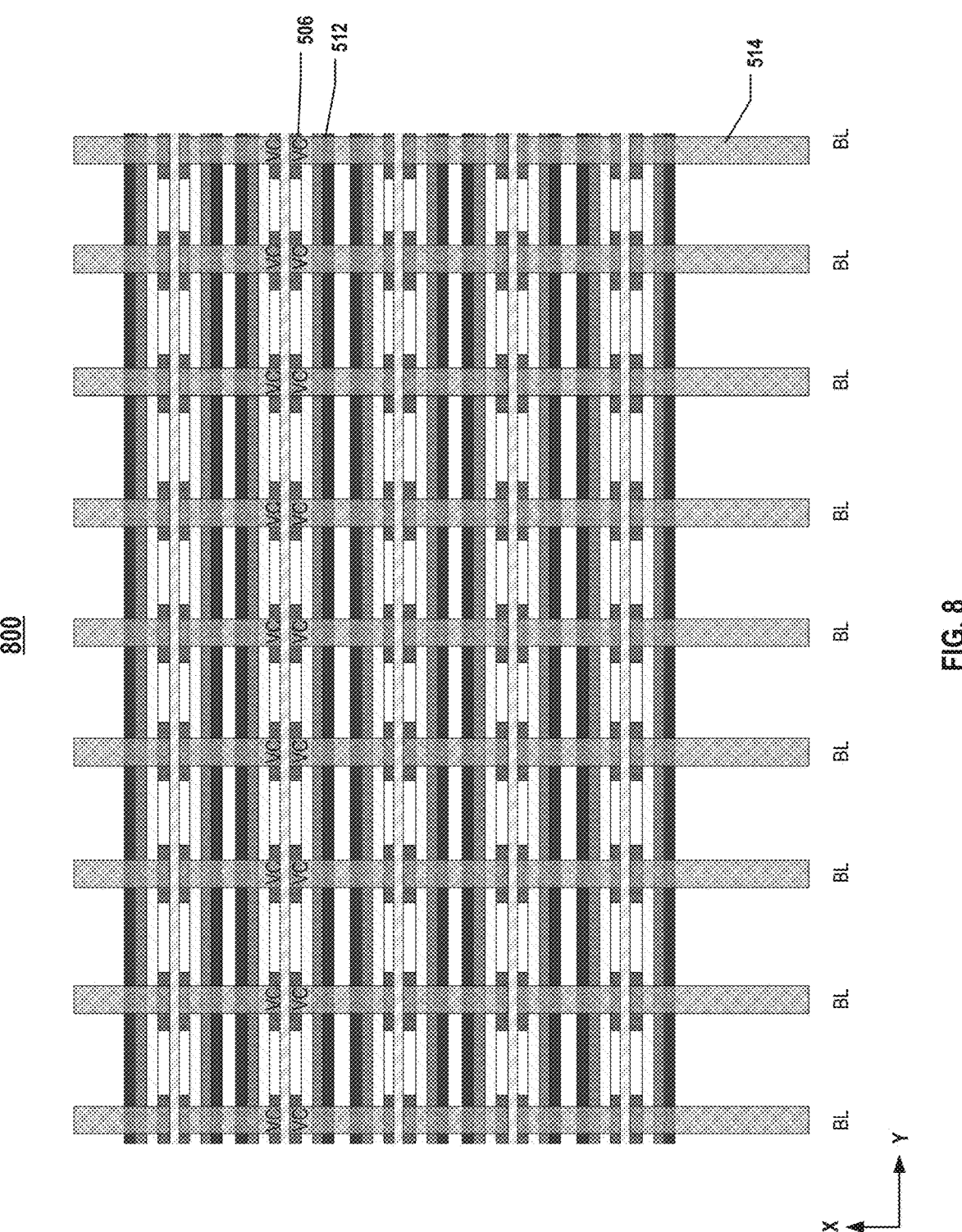
FIG. 8 illustrates a schematic view of a plan view of a memory device, according to some aspects of the present disclosure.

FIG. 8 illustrates a schematic view of a plan view of a memory device 800, according to some aspects of the present disclosure. As shown in FIG. 8, gate structure 512 may be formed on only one side of semiconductor body 506, and vertical transistor 504 is a single-side gate transistor. In other words, gate structure 512 may control the vertical transistor 504 from one side of semiconductor body 506. In some implementations, gate structure 512 may be a multiple-layer structure, including the gate dielectric layer, the barrier layer, and the metal gate layer.

Figure 9:
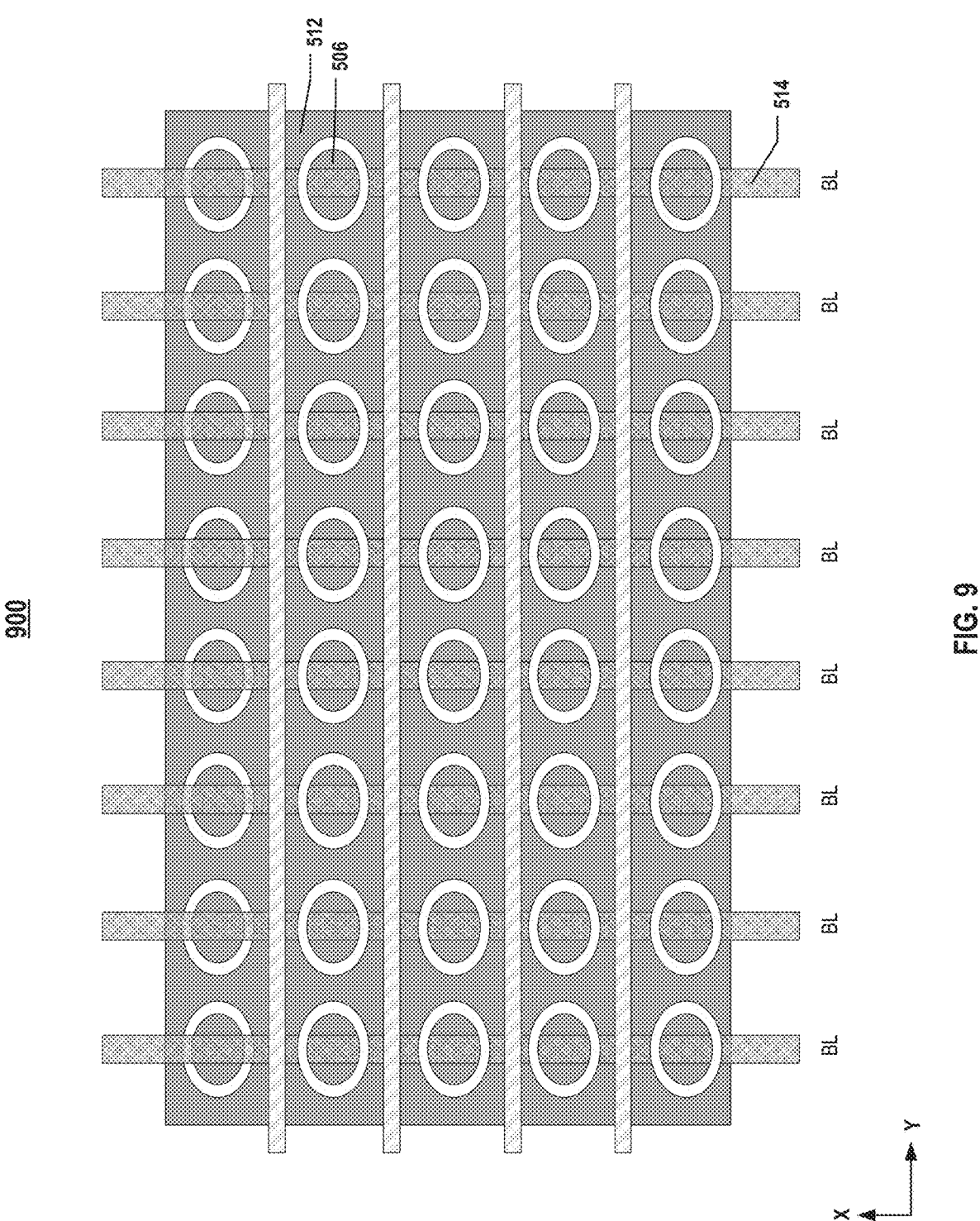
FIG. 9 illustrates a schematic view of a plan view of a memory device, according to some aspects of the present disclosure.

FIG. 9 illustrates a schematic view of a plan view of a memory device 900, according to some aspects of the present disclosure. As shown in FIG. 9, gate structure 512 may be formed surrounding semiconductor body 506, and vertical transistor 504 is a GAA transistor. In other words, gate structure 512 may control the vertical transistor 504 from the surrounding of semiconductor body 506. In some implementations, gate structure 512 may be a multiple-layer structure, including the gate dielectric layer, the barrier layer, and the metal gate layer.

By forming vertical transistor 504, instead of the horizontal-cell transistor structure, bit line 514 may be formed at the front side of the array wafer facing peripheral circuit 532. The array wafer may only have vertical transistor 504, bit line 514, and the metal redistribution layers, and all peripheral circuits including sense-amplifier, word-line (WL) driver, decoder, power, etc., are formed in the CMOS wafer. Then the array wafer and the CMOS wafer are bonded, e.g., hybrid bonded, together with high-density Cu-to-Cu bonding-via. In some implementations, the backside of the array wafer may be thinned to expose the bottom side, e.g., the source terminal, of vertical transistor 504, and storage unit 516 is formed on top of the source terminal of vertical transistor 504. The metal routing layers, including contact structure 518 and contact structure 520, and the pad out structure, including pad 522, are then formed at the backside of the array wafer after forming storage unit 516.

By forming bit line 514 on the first side of the cell array and storage unit 516 on the second side of the cell array, the complicated bit line process may be avoided, and the coupling capacitance between the bit lines may also be significantly reduced. Further, by using the hybrid-bonding process to bond the array wafer and the CMOS wafer, all control circuits, including the bit line control circuits, the word line control circuits, the sense amplifiers, the word line drivers/decoders, etc., may be placed underneath the cell array, and therefore the array efficiency can be significantly improved, and the cell size can be scaled down as well.

FIGS. 10-16 illustrate a fabrication process for forming memory device 500 including vertical transistor 504, according to some aspects of the present disclosure. FIG. 17 illustrates a flowchart of a method 1700 for forming memory device 500, according to some aspects of the present disclosure. For the purpose of better describing the present disclosure, the memory device 500 in FIGS. 10-16 and method 1700 in FIG. 17 will be discussed together. It is understood that the operations shown in method 1700 are not exhaustive and that other operations may be performed as well before, after, or between any of the illustrated operations. Further, some of the operations may be performed simultaneously, or in a different order than shown in FIGS. 10-16 and FIG. 17.

Figure 10:
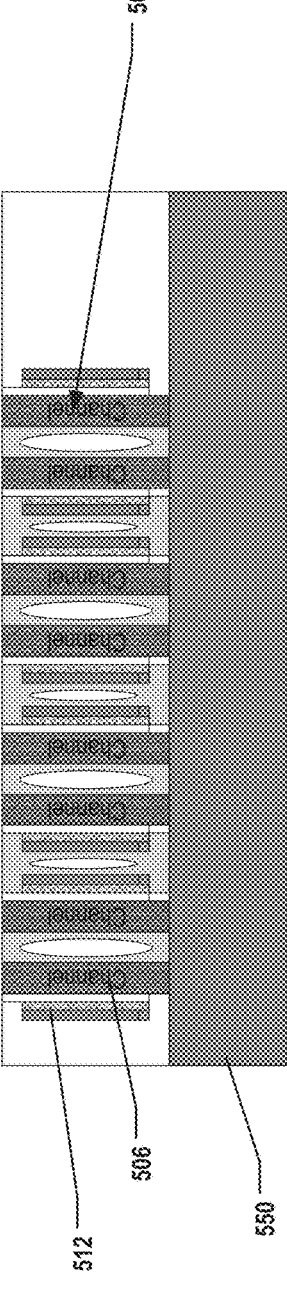
FIGS. 10-16 illustrate a fabrication process for forming a memory device including vertical transistors, according to some aspects of the present disclosure.

As shown in FIG. 10 and operation 1702 in FIG. 17, vertical transistor 504 is formed on a substrate 550. In some implementations, vertical transistor 504 includes semiconductor body 506 extending in the Z-direction. First terminal 508 and second terminal 510 may be located on both sides of semiconductor body 506. In some implementations, first terminal 508 and second terminal 510 may be the source terminal and the drain terminal of vertical transistor 504 after performing the activation operations later.

In some implementations, after forming semiconductor body 506, gate structure 512 may be formed on at least one side of semiconductor body 506. In some implementations, gate structure 512 may be a multiple-layer structure, including the gate dielectric layer, the barrier layer, and the metal gate layer. In some implementations, a planarization operation may be performed to expose semiconductor body 506.

In some implementations, a first trench may be formed in substrate 550 along the Z-direction and extends along the X-direction perpendicular to the Z-direction, and then a first trench isolation may be formed in the first trench. A second trench may be then formed in substrate 550 along the Z-direction and extending along the Y-direction perpendicular to the Z-direction and the X-direction, and then gate structure 512 may be formed in the second trench.

In some implementations, after forming the second trench, semiconductor body 506 is formed, extending along the Z-direction between the second trench and the first trench isolation. A third trench along the Z-direction and extending along the Y-direction may be formed to divide semiconductor body 506 for multiple memory cells, and then a second trench isolation may be formed in the third trench. As a result, semiconductor body 506 is formed, as shown in FIG. 10.

In some implementations, to form gate structure 512, a gate dielectric is formed over the exposed part of semiconductor body 506, a conductive layer is deposited over the gate dielectric, and the conductive layer is patterned to form a gate electrode over the gate dielectric. As a result, gate structure 512 may become word lines each extending in the word line direction (the Y-direction).

Figure 11:
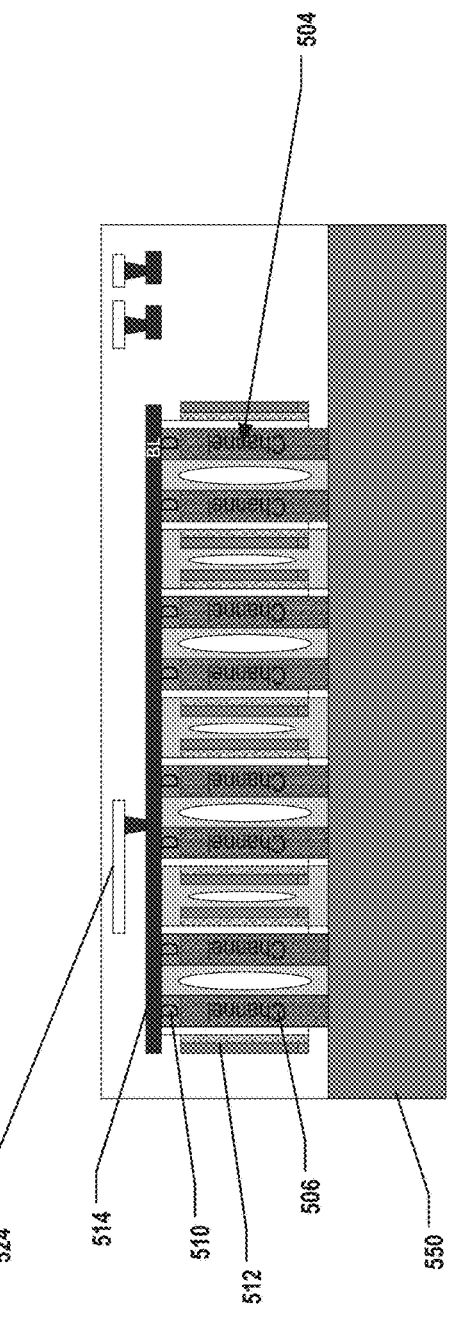
Figure 11:

As shown in FIG. 11 and operation 1704 in FIG. 17, bit line 514 is formed on second terminal 510 of vertical transistor 504. First, second terminal 510 of vertical transistor 504 (second terminal 510 of semiconductor body 506)

is doped to form a source/drain terminal, e.g., a drain terminal of vertical transistor 504. In some implementations, an implantation process and/or thermal diffusion process are performed to dope P-type dopants or N-type dopants to exposed upper ends of semiconductor bodies 506 to form the source/drain terminal. In some implementations, a silicide layer is formed on second terminal 510 by performing a silicidation process at the exposed upper ends of semiconductor body 506. Then, bit line 514 is formed on second terminal 510.

In some implementations, after forming bit line 514 on second terminal 510, some distribution layers, e.g., redistribution layer 524, may be formed on bit line 514.

Figure 12:
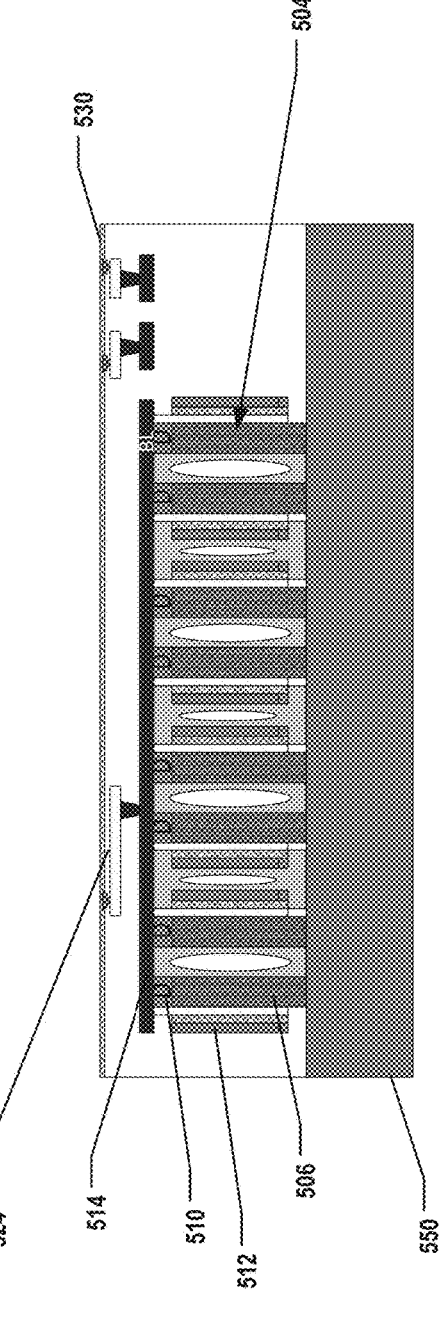

As shown in FIG. 12 and operation 1706 in FIG. 17, a bonding interface 530 is formed on vertical transistor 504. It is understood that bonding interface 530 is an interface prepared for bonding the array wafer and the CMOS wafer in a later operation. Bonding interface 530 may include some high-density metal contacts, e.g., Cu contacts, formed on the array wafer and/or the CMOS wafer.

Figure 13:

As shown in FIG. 13 and operation 1708 in FIG. 17, peripheral circuit 532 is formed on substrate 534. Peripheral circuit 532, including control and sensing circuits 536, may include any suitable digital, analog, and/or mixed-signal circuits used for facilitating the operations of the memory cell 502. For example, peripheral circuit 532 can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). Peripheral circuit 532 is formed on a substrate 534 using CMOS technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

Figure 14:
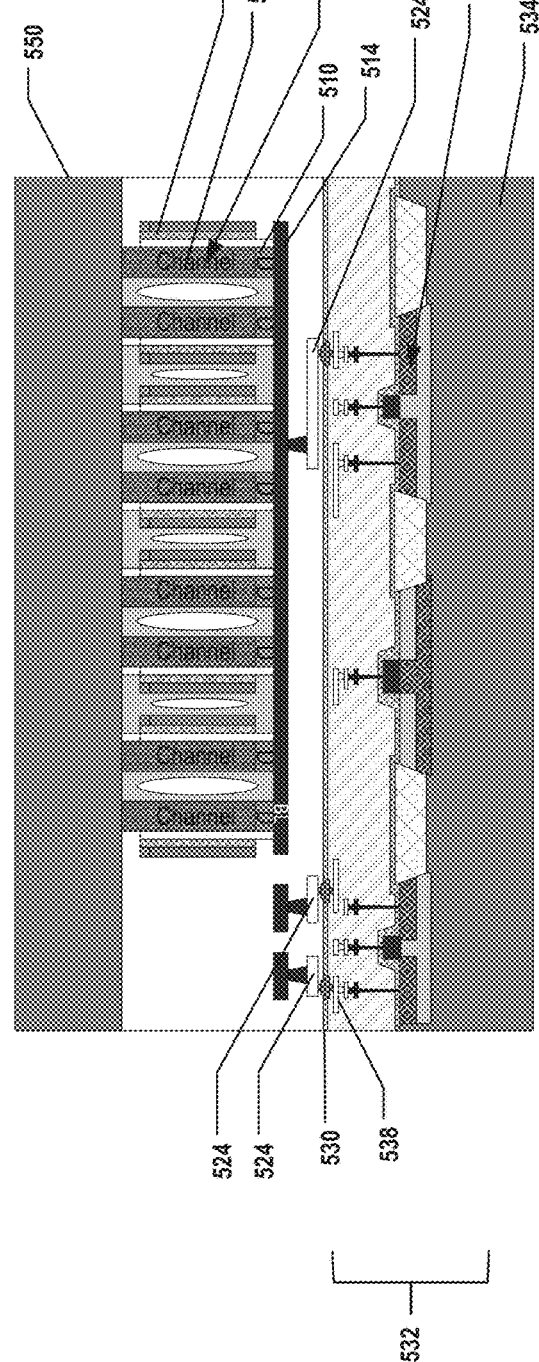

As shown in FIG. 14 and operation 1710 in FIG. 17, peripheral circuit 532 is bonded with bonding interface 530 in a face-to-face manner. In other words, peripheral circuit 532 is bonded with vertical transistor 504 in a face-to-face manner, and bonding interface 530 is the contacting boundary or interface of the array wafer and the CMOS wafer.

Figure 15:
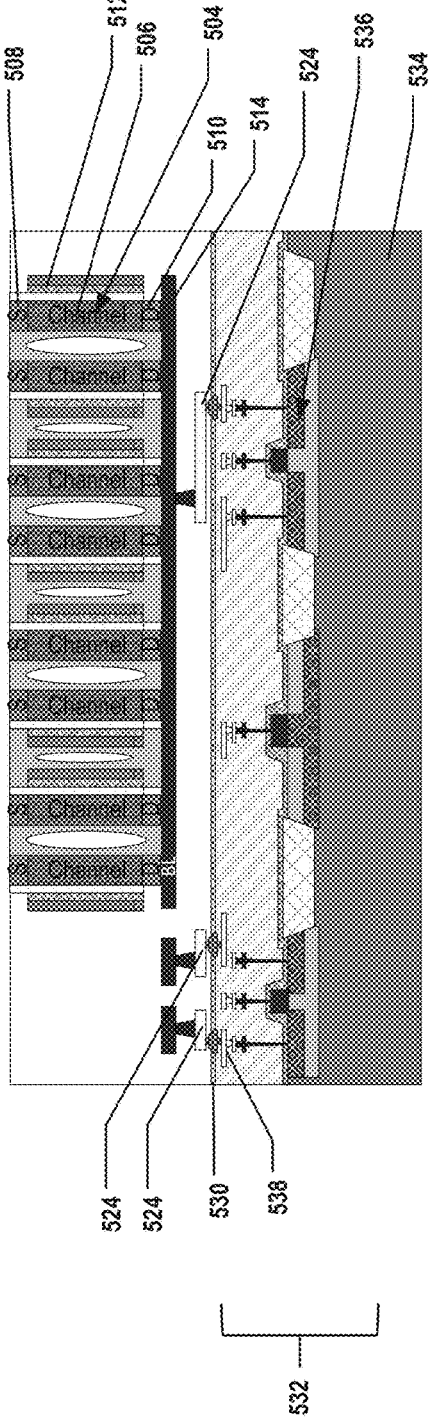

As shown in FIG. 15 and operation 1712 in FIG. 17, substrate 550 is removed to expose vertical transistor 504. Then, first terminal 508 of semiconductor body 506 is doped to form a source/drain terminal, e.g., a source terminal of vertical transistor 504. In some implementations, an implantation process and/or thermal diffusion process are performed to dope P-type dopants or N-type dopants to exposed upper ends of semiconductor bodies 506 to form the source/drain terminal. In some implementations, a silicide layer is formed on first terminal 508 by performing a silicidation process at the exposed end of semiconductor body 506.

Figure 16:
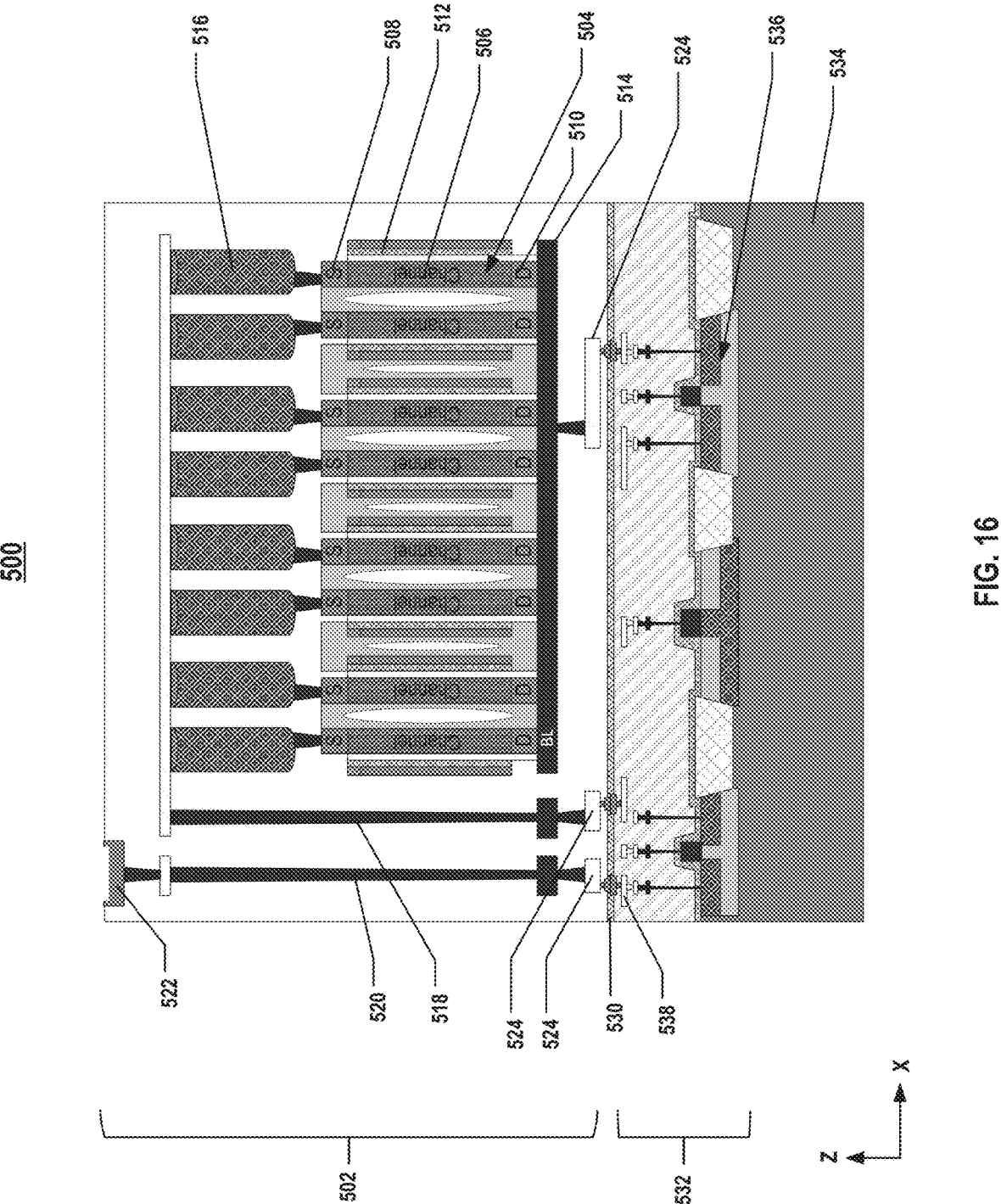
Figure 17:
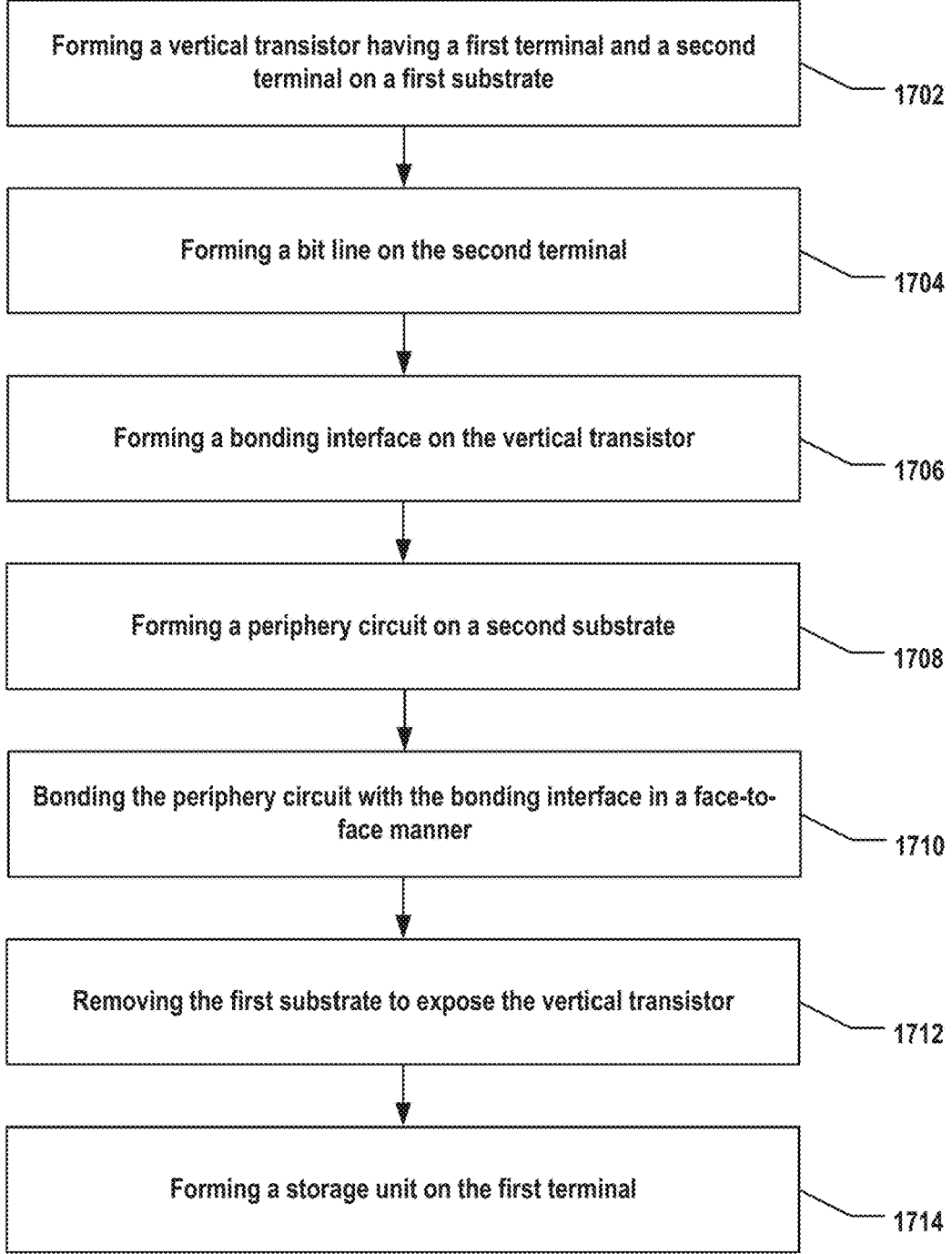
FIG. 17 illustrates a flowchart of a method for forming a memory device, according to some aspects of the present disclosure.

As shown in FIG. 16 and operation 1714 in FIG. 17, storage unit 516 is formed on first terminal 508. Then, the metal routing layers, including contact structure 518 and contact structure 520, and the pad out structure, including pad 522, are formed at the backside of the array wafer after forming storage unit 516.

Figure 18:
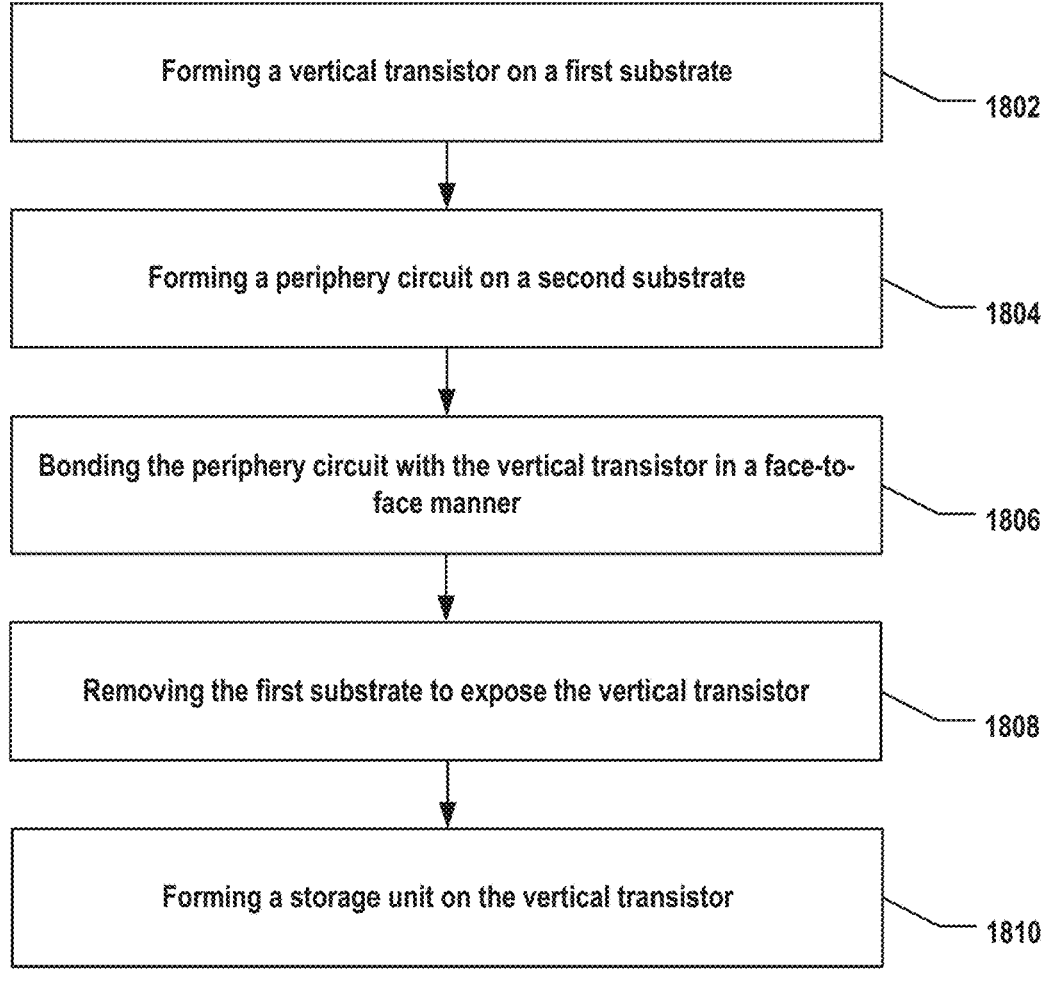
FIG. 18 illustrates a flowchart of a method for forming a memory device, according to some aspects of the present disclosure.

FIG. 18 illustrates a flowchart of a method 1800 for forming memory device 500, according to some aspects of the present disclosure. As shown in FIGS. 10-12 and operation 1802 in FIG. 18, vertical transistor 504 is formed on substrate 550. In some implementations, semiconductor body 506 is formed on substrate 550 extending along the Z-direction. Gate structure 512 is formed at a side of semiconductor body 506. Second terminal 510 is formed at a first end of semiconductor body 506. After removing substrate 550 in a later operation to expose vertical transistor 504, first terminal 508 is formed at a second end of semiconductor body 506.

In some implementations, as shown in FIG. 12, bonding interface 530 is formed on vertical transistor 504, and peripheral circuit 532 is bonded to bonding interface 530 later. In some implementations, bit line 514 is formed on second terminal 510, redistribution layer 524 is formed on bit line 514, and bonding interface 530 is formed on redistribution layer 524. It is understood that bonding interface 530 is an interface prepared for bonding the array wafer and the CMOS wafer in a later operation. Bonding interface 530 may include some high-density metal contacts, e.g., Cu contacts, formed on the array wafer and/or the CMOS wafer.

As shown in FIG. 13 and operation 1804 in FIG. 18, peripheral circuit 532 is formed on substrate 534. Peripheral circuit 532, including control and sensing circuits 536, may include any suitable digital, analog, and/or mixed-signal circuits used for facilitating the operations of the memory cell 502. For example, peripheral circuit 532 can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). Peripheral circuit 532 is formed on a substrate 534 using CMOS technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 14 and operation 1806 in FIG. 18, peripheral circuit 532 is bonded with vertical transistor 504 in a face-to-face manner. In other words, peripheral circuit 532 is bonded with vertical transistor 504 in a face-to-face manner, and bonding interface 530 is the contacting boundary or interface of the array wafer and the CMOS wafer.

As shown in FIG. 15 and operation 1808 in FIG. 18, substrate 550 is removed to expose vertical transistor 504. Then, first terminal 508 of semiconductor body 506 is doped to form a source/drain terminal, e.g., a source terminal of vertical transistor 504. In some implementations, an implantation process and/or thermal diffusion process are performed to dope P-type dopants or N-type dopants to exposed upper ends of semiconductor bodies 506 to form the source/drain terminal. In some implementations, a silicide layer is formed on first terminal 508 by performing a silicidation process at the exposed end of semiconductor body 506.

As shown in FIG. 16 and operation 1810 in FIG. 18, storage unit 516 is formed on vertical transistor 504. Then, the metal routing layers, including contact structure 518 and contact structure 520, and the pad out structure, including pad 522, are formed at the backside of the array wafer after forming storage unit 516.

By forming vertical transistor 504, instead of the horizontal-cell transistor structure, bit line 514 may be formed at the front side of the array wafer facing peripheral circuit 532. The array wafer may only have vertical transistor 504, bit line 514, and the metal redistribution layers, and all peripheral circuits including sense-amplifier, word-line (WL) driver, decoder, power, etc., are formed in the CMOS wafer. Then the array wafer and the CMOS wafer are bonded, e.g., hybrid bonded, together with high-density Cu-to-Cu bonding-via. In some implementations, the backside of the array wafer may be thinned to expose the bottom side, e.g., the source terminal, of vertical transistor 504, and storage unit 516 is formed on top of the source terminal of vertical transistor 504. The metal routing layers, including contact structure 518 and contact structure 520, and the pad out structure, including pad 522, are then formed at the backside of the array wafer after forming storage unit 516.

By forming bit line 514 on the first side of the cell array and storage unit 516 on the second side of the cell array, the complicated bit line process may be avoided, and the coupling capacitance between the bit lines may also be significantly reduced. Further, by using the hybrid-bonding process to bond the array wafer and the CMOS wafer, all control circuits, including the bit line control circuits, the word line control circuits, the sense amplifiers, the word line drivers/decoders, etc., may be placed underneath the cell array, and therefore the array efficiency can be significantly improved, and the cell size can be scaled down as well.

Figure 19:
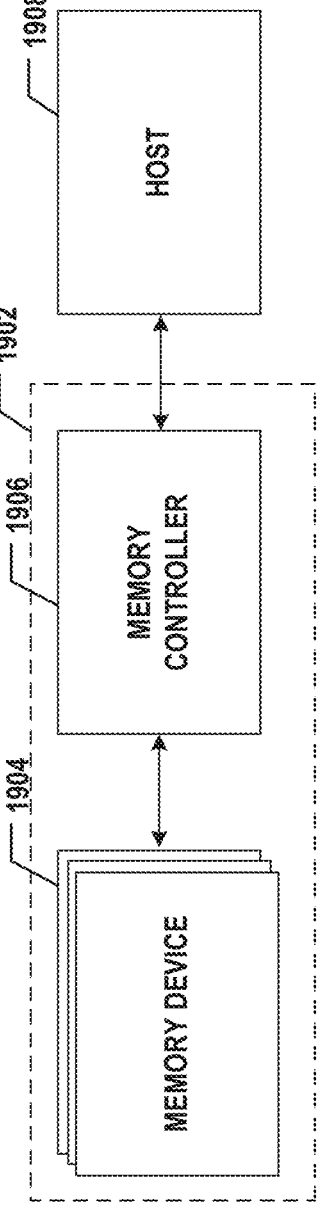
FIG. 19 illustrates a block diagram of an exemplary system having a memory device, according to some aspects of the present disclosure.

FIG. 19 illustrates a block diagram of a system 1900 having a memory device, according to some aspects of the present disclosure. System 1900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 19, system 1900 can include a host 1908 and a memory system 1902 having one or more memory devices 1904 and a memory controller 1906. Host 1908 can be a processor of an electronic device, such as a central processing unit (CPU), or a system-on-chip (SoC), such as an application processor (AP). Host 1908 can be configured to send or receive the data to or from memory devices 1904.

Memory device 1904 can be any memory devices disclosed herein, such as memory devices 500, 700, 800, or 900. In some implementations, memory device 1904 includes an array of memory cells each including a vertical transistor, as described above in detail.

Memory controller 1906 is coupled to memory device 1904 and host 1908 and is configured to control memory device 1904, according to some implementations. Memory controller 1906 can manage the data stored in memory device 1904 and communicate with host 1908. Memory controller 1906 can be configured to control operations of memory device 1904, such as read, write, and refresh operations. Memory controller 1906 can also be configured to manage various functions with respect to the data stored or to be stored in memory device 1904 including, but not limited to refresh and timing control, command/request translation, buffer and schedule, and power management. In some implementations, memory controller 1906 is further configured to determines the maximum memory capacity that the computer system can use, the number of memory banks, memory type and speed, memory particle data depth and data width, and other important parameters. Any other suitable functions may be performed by memory controller 1906 as well. Memory controller 1906 can communicate with an external device (e.g., host 1908) according to a particular communication protocol. For example, memory controller 1906 may communicate with the external device through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
   a memory cell comprising:
      a vertical transistor having a first terminal and a second terminal;
      a storage unit having a first end coupled to the first terminal of the vertical transistor; and
      a bit line coupled to the second terminal of the vertical transistor; and
   a peripheral circuit coupled to the bit line,
   wherein the vertical transistor comprises a semiconductor body extending in a first direction, and a gate structure coupled to at least one side of the semiconductor body; and
   the bit line is disposed between the vertical transistor and the peripheral circuit along the first direction.

2. The memory device of claim 1, wherein the bit line is coupled to the second terminal of the vertical transistor via a contact and extends in a second direction perpendicular to the first direction.

3. The memory device of claim 2, wherein the gate structure is coupled to two sides of the semiconductor body along the second direction.

4. The memory device of claim 2, wherein the gate structure is in contact with one or more sides of the semiconductor body.

5. The memory device of claim 1, further comprising:
   a bonding interface disposed between the memory cell and the peripheral circuit,
   wherein the bit line is coupled to the peripheral circuit through a metallic bonding pad of the bonding interface.

6. The memory device of claim 5, further comprising:
   a redistribution layer disposed between the bit line and the bonding interface,
   wherein a second end of the storage unit is coupled to the redistribution layer through a contact structure;
   the bit line is coupled to the redistribution layer; and
   the redistribution layer is coupled to the bonding interface.

7. A memory system, comprising:
   a memory device configured to store data, and comprising:
      a memory cell comprising:
         a vertical transistor having a first terminal and a second terminal;
         a storage unit having a first end coupled to the first terminal of the vertical transistor; and
         a bit line coupled to the second terminal of the vertical transistor; and
      a peripheral circuit coupled to the bit line, wherein the vertical transistor comprises a semiconductor body extending in a first direction, and a gate structure coupled to at least one side of the semiconductor body; and the bit line is disposed between the vertical transistor and the peripheral circuit along the first direction; and a memory controller coupled to the memory device and configured to control the memory cell through the peripheral circuit.

8. A method for forming a memory device, comprising:

forming a vertical transistor having a first terminal and a second terminal on a first substrate;

forming a bit line on the second terminal;

forming a bonding interface on the vertical transistor;

forming a peripheral circuit on a second substrate;

bonding the peripheral circuit with the bonding interface in a face-to-face manner;

removing the first substrate to expose the vertical transistor; and forming a storage unit on the first terminal.

9. The method of claim 8, wherein forming the vertical transistor having the first terminal and the second terminal on the first substrate, comprising:

forming a first trench in the first substrate along a first direction and extending along a second direction perpendicular to the first direction;

forming a first trench isolation in the first trench;

forming a second trench in the first substrate along the first direction and extending along a third direction perpendicular to the first direction and the second direction; and forming a gate structure in the second trench.

10. The method of claim 9, wherein after forming the second trench, a semiconductor body is formed extending along the first direction between the second trench and the first trench isolation.

11. The method of claim 10, further comprising:

forming a third trench along the first direction and extending along the third direction to divide the semiconductor body; and forming a second trench isolation in the third trench.

12. The method of claim 10, further comprising:

performing a doping operation on a first end of the semiconductor body to form the second terminal.

13. The method of claim 8, wherein removing the first substrate to expose the vertical transistor, comprises:

performing a planarization operation having the second substrate as a support substrate.

14. The method of claim 13, further comprising, comprises:

performing an implantation operation and a thermal diffusion operation on an exposed semiconductor body to form the first terminal at a second end of the semiconductor body.

15. The method of claim 8, wherein the storage unit is formed after bonding the peripheral circuit with the bonding interface.

16. A method for forming a memory device, comprising:

forming a vertical transistor on a first substrate;

forming a peripheral circuit on a second substrate;

bonding the peripheral circuit with the vertical transistor in a face-to-face manner;

removing the first substrate to expose the vertical transistor; and forming a storage unit on the vertical transistor.

17. The method of claim 16, wherein forming the vertical transistor on the first substrate, comprises:

forming a semiconductor body on the first substrate extending along a first direction;

forming a gate structure at a side of the semiconductor body;

forming a second terminal at a first end of the semiconductor body; and after removing the first substrate to expose the vertical transistor, forming a first terminal at a second end of the semiconductor body.

18. The method of claim 17, wherein bonding the peripheral circuit with the vertical transistor in the face-to-face manner, comprises:

forming a bonding interface on the vertical transistor; and bonding the peripheral circuit to the bonding interface.

19. The method of claim 17, wherein bonding the peripheral circuit with the vertical transistor in the face-to-face manner, comprises:

forming a bit line on the second terminal;

forming a redistribution layer on the bit line;

forming a bonding interface on the redistribution layer; and bonding the peripheral circuit to the bonding interface.

20. The method of claim 16, wherein removing the first substrate to expose the vertical transistor, comprises:

removing the first substrate using the second substrate as a support substrate to expose the vertical transistor.

* * * * *